US010163666B2

(12) United States Patent
Han et al.

(10) Patent No.: US 10,163,666 B2
(45) Date of Patent: *Dec. 25, 2018

(54) TEMPERATURE CONTROL SYSTEM FOR SEMICONDUCTOR MANUFACTURING SYSTEM

(71) Applicant: Techest. Co., Ltd, Anseong-si, Gyeonggi-do (KR)

(72) Inventors: Min Jin Han, Osan-si (KR); Jae Geon Kim, Osan-si (KR)

(73) Assignee: TECHEST. CO., LTD., Anseong-si, Gyeonggi-do (KR)

(*) Notice: Subject to any disclaimer, the term of this patent is extended or adjusted under 35 U.S.C. 154(b) by 276 days.

This patent is subject to a terminal disclaimer.

(21) Appl. No.: 15/053,409

(22) Filed: Feb. 25, 2016

(65) Prior Publication Data

US 2016/0169563 A1 Jun. 16, 2016

Related U.S. Application Data

(62) Division of application No. 14/263,498, filed on Apr. 28, 2014, now Pat. No. 9,520,308.

(30) Foreign Application Priority Data

Oct. 17, 2013 (KR) .................. 10-2013-0124093

(51) Int. Cl.
*F25B 21/02* (2006.01)
*H01L 21/67* (2006.01)
(Continued)

(52) U.S. Cl.
CPC ........ *H01L 21/67109* (2013.01); *F25B 21/02* (2013.01); *F28F 27/02* (2013.01);
(Continued)

(58) Field of Classification Search
CPC ........ H01L 21/67109; H01L 21/67248; H01L 21/6831; F25B 21/02; F25B 2321/021; F28F 27/02
See application file for complete search history.

(56) References Cited

U.S. PATENT DOCUMENTS 6,117,245 A * 9/2000 Mandrekar ....... H01J 37/32522
118/724
6,295,819 B1 * 10/2001 Mathiprakasam ...... F25B 21/02
62/3.3
(Continued)

FOREIGN PATENT DOCUMENTS

KR 10-0817419 B1 3/2008
KR 10-1020357 B1 3/2011

*Primary Examiner* — Filip Zec
(74) *Attorney, Agent, or Firm* — Rabin & Berdo, P.C.

(57) ABSTRACT

Provided is a temperature control system configured to mix a low temperature heating medium and a high temperature heating medium to supply the heating mediums at a temperature according to a process recipe to an electrostatic chuck (ESC) configured to maintain a temperature and support a wafer in a chamber in which a semiconductor wafer processing process is performed, and a heating medium obtained by mixing a heating medium cooled through a thermoelectric element and a heating medium heated through a heater to a desired target temperature according to a first ratio and a second ratio is provided to a load and recovered from the load, and the heating medium is distributed to the thermoelectric element and the heater according to the first ratio and the second ratio, which are ratios upon the mixing, optimizing power consumption for cooling or heating.

3 Claims, 5 Drawing Sheets

(51) Int. Cl.
*H01L 21/683* (2006.01)
*F28F 27/02* (2006.01)
(52) U.S. Cl.
CPC .... *H01L 21/67248* (2013.01); *H01L 21/6831* (2013.01); *F25B 2321/021* (2013.01)

(56) References Cited

U.S. PATENT DOCUMENTS

| | | | | |
|---|---|---|---|---|
| 6,461,801 | B1* | 10/2002 | Wang | H01L 21/67109 165/61 |
| 6,908,512 | B2* | 6/2005 | Ivanov | B24B 37/30 118/503 |
| 8,410,393 | B2* | 4/2013 | Ricci | H01J 37/32715 118/715 |
| 9,410,753 | B2* | 8/2016 | Makabe | F28F 27/02 |
| 2008/0271471 | A1* | 11/2008 | Nozawa | C23C 16/4411 62/179 |
| 2009/0118872 | A1* | 5/2009 | Nonaka | G05D 23/1934 700/285 |

* cited by examiner

TEMPERATURE CONTROL SYSTEM FOR SEMICONDUCTOR MANUFACTURING SYSTEM

CROSS-REFERENCE TO RELATED APPLICATION

This is a division of application Ser. No. 14/263,498, filed Apr. 28, 2014. Further, this application claims priority to and the benefit of Korean Patent Application No. 2013-0124093, filed on Oct. 17, 2013, the disclosure of which is incorporated herein by reference in its entirety.

BACKGROUND

1. Field of the Invention

The present invention relates to a temperature control system for a semiconductor manufacturing system, and more particularly, to a temperature control system configured to mix a low temperature heating medium and a high temperature heating medium to supply the heating medium to an electrostatic chuck (ESC) configured to maintain a temperature while supporting a wafer in a chamber in which a semiconductor wafer processing process is performed at a temperature according to a process recipe.

2. Discussion of Related Art

As semiconductor device technology gradually advances, control precision of equipment applied to a semiconductor manufacturing system also becomes important. In particular, vacuum chambers in which various deposition and etching processes of semiconductor substrate materials such as, in particular, silicon wafers, are performed require precise temperature control according to each process recipe.

In recent times, the semiconductor manufacturing system requires stable maintenance of a temperature when the temperature is a desired temperature and rapid variation of a temperature when a temperature in the process recipe is varied. In particular, in recent times, while variation in temperature is required even in a unit step of the process recipe, it is difficult for an external temperature control system to deal with the variation in temperature.

FIG. 1 shows a conventional configuration in which a temperature of an electrostatic chuck 22 in a chamber 20 is uniformly maintained through a chiller 10.

As shown, a heating medium cooled to a constant temperature is provided to the electrostatic chuck 22 in the chamber 20 though the chiller 10 to deal with a predetermined temperature section of the process recipe. In recent times, in a process of manufacturing a fine multi-layer structure, a temperature should be varied even in a specific unit section.

For this, in recent times, the electrostatic chuck 22 may further include a tunable heater such that the temperature in the specific unit section can be controlled by the chamber itself.

FIG. 2 shows the electrostatic chuck 22 having a tunable heater 23. For example, when the heating medium of 20° C., which is set to a target temperature of a specific unit section in the chiller 10, is continuously supplied, if a temperature of 25° C. is needed in the corresponding unit section, the tunable heater 23 is operated to increase the temperature of the electrostatic chuck 22 to 25° C.

Eventually, since such a configuration cannot easily use the external temperature control, which requires a relatively long time to deal with the variation in temperature, and enforces an abrupt variation in temperature through the tunable heater, efficiency in power is substantially degraded.

In addition, it is not preferable to install the heater in the electrostatic chuck 22 due to disturbance of radio frequency (RF) power applied to an upper electrode or a shower head 21 in the chamber 20 as shown in FIG. 1.

Accordingly, a temperature control system configured to appropriately mix heating media having different temperatures to rapidly set the temperature of the heating media to a desired target temperature has been proposed.

Since an unstable state upon temperature control continues for a substantially long time due to a substantial thermal capacity of the electrostatic chuck, the heating medium having a sufficient flow rate is required for the temperature control. Accordingly, in recent times, a method of mixing a cooled heating medium and a heated heating medium and providing the mixed heating medium to the electrostatic chuck, a method of appropriately mixing a separately cooled or heated heating medium with a recovered heating medium and supplying the mixed heating medium, or the like, is proposed.

However, in most cases, since the heating medium recovered from the electrostatic chuck is equally supplied to heating medium tanks (reservoirs) of a cooling means and a heating means, power consumption for adjusting the temperature of the recovered heating medium to the set temperatures of the cooling means and the heating means becomes severe. In addition, since a substantial thermal shock is generated when a difference between the temperature of the recovered heating medium and a temperature to be controlled is abruptly increased due to a variation in temperature required by a load, overshoot or undershoot is frequently generated when dealing with the temperature using a conventional control method (for example, proportional-integral-derivative (PID) control), which makes it difficult to control the temperature.

Eventually, a novel type of temperature control system for providing a heating medium having a desired set temperature at a sufficient flow rate, reducing a thermal shock, and minimizing calories for cooling or heating the recovered heating medium is needed.

CITATION LIST

Patent Literature (Patent Literature 1) Korean Patent Registration No. 10-0817419
(Patent Literature 2) Korean Patent Registration No. 10-1020357

SUMMARY OF THE INVENTION

In order to solve the problems, an object of an embodiment of the present invention is directed to a temperature control system for a semiconductor manufacturing system capable of mixing a heating medium cooled through a thermoelectric element and a heating medium heated through a heater to a desired target temperature according to a first ratio and a second ratio and providing the mixed heating medium to a load, and distributing the heating medium recovered from the load into the thermoelectric element and the heater at the first ratio and the second ratio, which are ratios upon mixing, to minimize power consumption for cooling or heating.

An object of another embodiment of the present invention is directed to a temperature control system for a semiconductor manufacturing system capable of rapidly dealing with temperatures of cooling tanks even when a target temperature of a heating medium supplied to a load is varied, by providing the heating medium having a set temperature to a mixer at a specific ratio such that temperatures of the heating medium tanks (reservoirs) installed at a chiller unit and a heater unit are maintained at different set temperatures, and circulating the remaining ratio of the heating medium, which is not provided, through a chiller unit and a heater unit through a bypass to maintain or vary temperatures of the heating medium tanks to desired set temperatures through continuous circulation.

An object of another embodiment of the present invention is directed to a temperature control system for a semiconductor manufacturing system capable of minimizing a thermal shock even with respect to an abrupt variation in temperature to reduce generation of undershoot or overshoot by configuring a thermoelectric element block and a heater of a chiller unit and a heater unit in a dual structure, primarily cooling or heating the recovered and bypassed heating medium to about a set temperature, and secondarily cooling or heating the heating medium to a target temperature upon recovery and supply to the heating medium tank.

An object of another embodiment of the present invention is directed to a temperature control system for a semiconductor manufacturing system further including a heat exchanger at a heater unit to use a thermoelectric element block as a cooling means of a chiller unit and utilize a cooling water flow path configured to cool heat generated by a cooling operation of the thermoelectric element block, and capable of recovering residual heat, which is wasted, by further utilizing the heat when a temperature of a recovered heating medium or a bypass heating medium near the heater is lower than that of the residual heat of the cooling water, or utilizing the heat to cool the heating medium heated by the heater.

In order to accomplish the above-mentioned objects, a temperature control system for a semiconductor manufacturing system according to an embodiment of the present invention is a temperature control system configured to control cooling and heating of a heating medium recovered from a load of a semiconductor manufacturing system to supply the heating medium at a target temperature, which includes a mixer configured to mix a low temperature heating medium and a high temperature heating medium to supply the mixed heating medium to a load; a first heating medium tank configured to store the low temperature heating medium; a first thermoelectric element block configured to cool and provide the heating medium of the first heating medium tank; a second thermoelectric element block configured to cool the recovered heating medium to provide the recovered heating medium to the first heating medium tank; a first 3-way switching valve configured to provide the cooled heating medium of the first heating medium tank provided through the first thermoelectric element block to the mixer at a first ratio and bypass the remaining heating medium to the second thermoelectric element block to recover the remaining heating medium in the first heating medium tank; a second heating medium tank configured to store the high temperature heating medium; a first heater configured to heat the heating medium in the second heating medium tank; a second heater configured to heat the recovered heating medium and provide the recovered heating medium to the second heating medium tank; a second 3-way switching valve configured to provide the heating medium of the second heating medium tank heated through the first heater to the mixer at a second ratio, bypass the heating medium to the second heater, and recover the remaining heating medium in the second heating medium tank; and a third 3-way switching valve configured to provide the heating medium recovered from the load to the second thermoelectric element block at the first ratio and provide the heating medium to the second heater at the second ratio.

Here, the temperature control system for the semiconductor manufacturing system may further include a process cooling water flow path passing through the thermoelectric element block to cool the first and second thermoelectric element blocks.

Meanwhile, the temperature control system for the semiconductor manufacturing system may further include a heat exchanger installed in front of or behind the second heater, connected to the cooling water flow path passing through the thermoelectric element block, and operated when a cooling water temperature is within a temperature range in which the recovered heating medium is heated or cooled to a desired temperature.

The second thermoelectric element block may cool the recovered heating medium to a preset temperature between the recovered heating medium temperature and a set cooling temperature, and the first thermoelectric element block may cool the heating medium cooled to the preset temperature by the second thermoelectric element block to the preset cooling temperature to reduce a thermal shock.

The second heater may heat the recovered heating medium to a preset temperature between the recovered heating medium temperature and a set heating temperature, and the first heater may heat the heating medium heated to the preset temperature by the second heater to the set heating temperature to reduce a thermal shock.

The first, second and third 3-way switching valves may be controlled with reference to a flow rate.

A temperature control system for a semiconductor manufacturing system according to another embodiment of the present invention is a temperature control system configured to cool and heat a heating medium recovered from an operating load of a semiconductor manufacturing system and supply the heating medium at a target temperature, which include: a mixer configured to mix a low temperature heating medium and a high temperature heating medium and supply the mixed heating medium to the load; a first heating medium tank configured to store the low temperature heating medium; a thermoelectric element block configured to cool the heating medium and provide the heating medium to the first heating medium tank; a first 3-way switching valve configured to provide the cooled heating medium of the first heating medium tank to the mixer at a first ratio and bypass the remaining heating medium to be recovered into the first heating medium tank through the thermoelectric element block; a second heating medium tank configured to store the high temperature heating medium; a heater configured to heat the heating medium and provide the heating medium to the second heating medium tank; a second 3-way switching valve configured to provide the heated heating medium of the second heating medium tank to the mixer at a second ratio and bypass the remaining heating medium to be recovered to the second heating medium tank through the heater; and a third 3-way switching valve configured to provide the heating medium recovered from the load to thermoelectric element block at the first ratio and provide the heating medium to the heater at the second ratio.

A temperature control system for a semiconductor manufacturing system according to another example of the present invention includes: a mixer configured to mix a low temperature heating medium and a high temperature heating medium and supply the mixed heating medium to an operating load of the semiconductor manufacturing system; a first heating medium tank configured to store the low temperature heating medium; a thermoelectric element block configured to cool the heating medium and provide the heating medium to the first heating medium tank; a first 3-way switching valve configured to provide the cooled heating medium of the first heating medium tank to the mixer at a first ratio and bypass the remaining heating medium to be recovered in the first heating medium tank through the thermoelectric element block; a second heating medium tank configured to store the high temperature heating medium; a heater configured to heat the heating medium and provide the heating medium to the second heating medium tank; a second 3-way switching valve configured to provide the heated heating medium of the second heating medium tank to the mixer at a second ratio and bypass the remaining heating medium to be recovered in the second heating medium tank through the heater; a third 3-way switching valve configured to distribute the heating medium recovered from the load to the thermoelectric element block and the heater; a sensor unit configured to measure a temperature of the heating medium cooled by the thermoelectric element block and a temperature of the heating medium heated by the heater, and measure a flow rate of a connecting section of the first, second and third switching valves according to operations of the valves; a temperature control unit configured to receive set values of a cooling temperature of the thermoelectric element block, a heating temperature of the heater, and a temperature of the mixed heating medium to be supplied to the operating load, and control operations of the thermoelectric element block and the heater with reference to the temperatures of the sensor unit; and a valve control unit configured to control the first and second 3-way switching valves to the first and second ratios with reference to the flow rates and the temperatures of the cooled and heated heating media provided by the sensor unit, and control the operating ratio of the third 3-way switching valve configured to distribute the recovered heating medium to the thermoelectric element block and the heater according to the ratio upon the supply.

The temperature control system for the semiconductor manufacturing system according to the embodiment of the present invention can mix the heating medium cooled through the thermoelectric element and the heating medium heated through the heater to a desired target temperature according to a first ratio and a second ratio and provide the mixed heating medium to the load, and distribute the heating medium recovered from the load to the thermoelectric element and the heater at the first ratio and the second ratio, which are ratios upon mixing, to optimize power consumption for cooling or heating.

The temperature control system for the semiconductor manufacturing system according to the embodiment of the present invention can provide the heating medium having a set temperature to the mixer at a specific ratio such that temperatures of the heating medium tanks installed at the chiller unit and the heater unit are maintained at different set temperatures, and circulate the remaining ratio of the heating medium, which is not provided, through the chiller unit and the heater unit through the bypass to maintain or vary temperatures of the heating medium tanks to desired set temperatures through continuous circulation, rapidly dealing with the temperature even when the target temperature of the heating medium to be supplied to the load is varied.

The temperature control system for the semiconductor manufacturing system according to the embodiment of the present invention can minimize a thermal shock even with respect to an abrupt variation in temperature to reduce generation of undershoot or overshoot by configuring the thermoelectric element block and the heater of the chiller unit and the heater unit in a dual structure, primarily cooling or heating the recovered and bypassed heating medium to about a set temperature, and secondarily cooling or heating the heating medium to a target temperature upon recovery and supply to the heating medium tank.

The temperature control system for the semiconductor manufacturing system according to the embodiment of the present invention further includes the heat exchanger at a heater unit to use a thermoelectric element block as a cooling means of a chiller unit and utilize a cooling water flow path configured to cool heat generated by a cooling operation of the thermoelectric element block, and capable of recovering residual heat, which is wasted, by further utilizing the heat when a temperature of a recovered heating medium or a bypass heating medium near the heater is lower than that of the residual heat of the cooling water, and decreasing the temperature of the heating medium heated by the heater according to necessity, thereby optimizing energy efficiency.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Embodiments of the present invention will be described with reference to the accompanying drawings.

Figure 1:
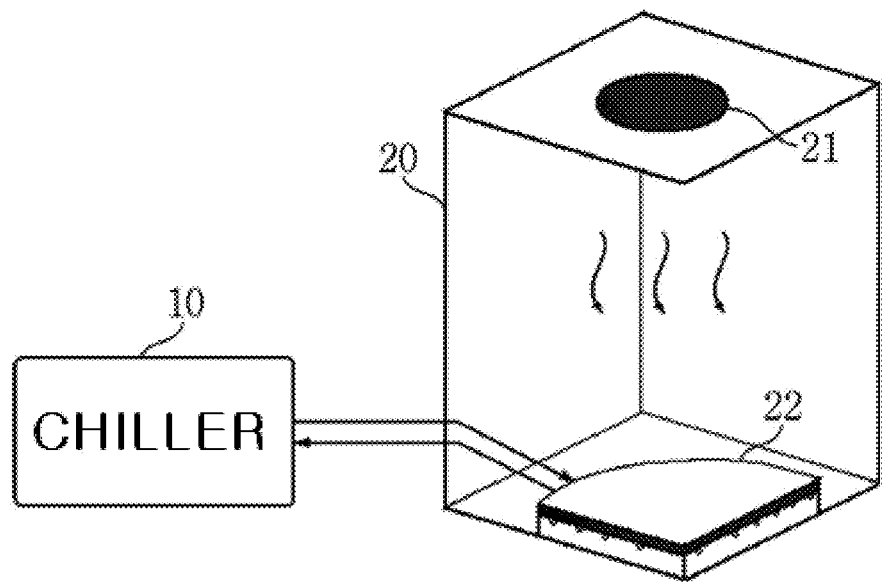
FIG. 1 is a view showing a configuration of a system for controlling a temperature of an electrostatic chuck of a conventional chamber.
Figure 2:
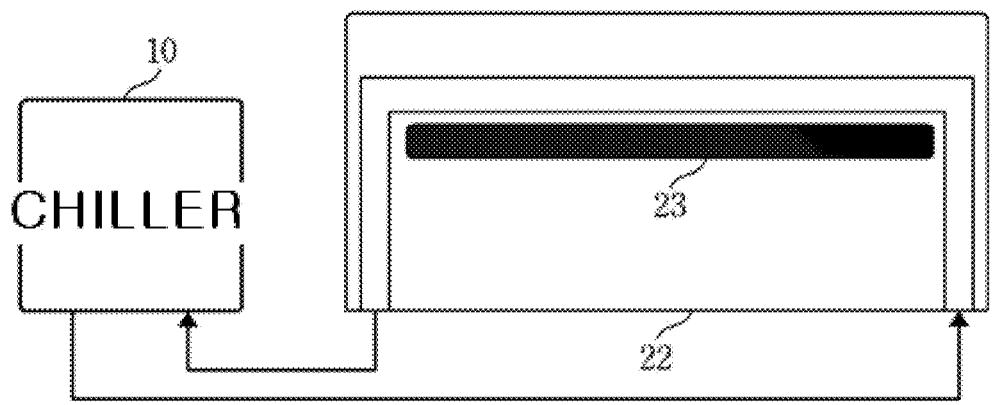
FIG. 2 is a view showing a configuration of a temperature control system of the electrostatic chuck including a conventional tunable heater.
Figure 3:
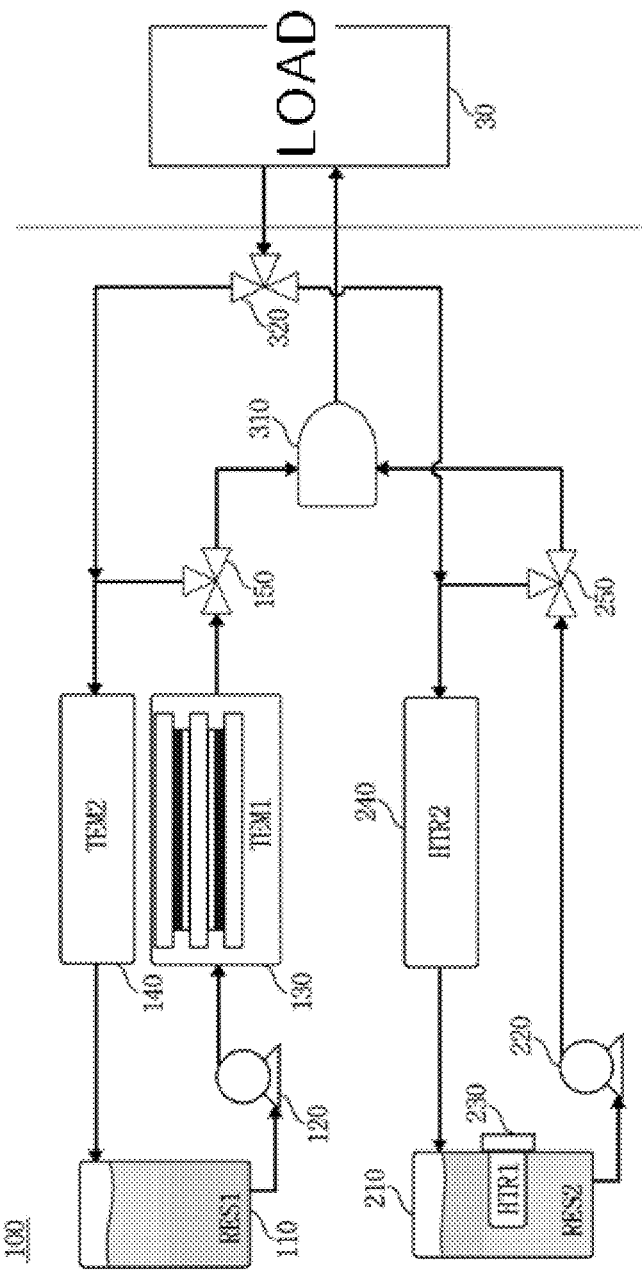
FIG. 3 is a schematic view of a configuration of a temperature control system according to the embodiment of the present invention.

First, FIG. 3 shows a configuration of a temperature control system 100 for a semiconductor manufacturing system according to an embodiment of the present invention. As shown, a chiller unit 110 to 150 is provided at an upper end, a heater unit 210 to 250 is provided at a lower end, and a mixer 310 and a 3-way switching valve are provided at a right side connected to a load 30.

The temperature control system 100 is a temperature control system configured to mix a heating medium cooled through thermoelectric element blocks 130 and 140 and a heating medium heated through heaters 230 and 240 in the mixer 310 to a desired target temperature and provide the mixed heating medium to the load (for example, an electrostatic chuck) 30, and distribute the heating medium recovered from the load 30 to the thermoelectric element blocks and the heaters again.

The chiller unit includes a first heating medium tank 110, a supply path thermoelectric element 130 configured to cool the heating medium of the first heating medium tank 110 to a target temperature, a recovery path thermoelectric element 140 configured to cool the recovered heating medium and transmit to the cooled heating medium to the first heating medium tank 110, and a first 3-way switching valve 150 configured to provide a certain ratio of the heating medium provided by the supply path thermoelectric element 130 to the mixer 310 and bypass the remaining heating medium to the recovery path thermoelectric element 140.

The heater unit includes a second heating medium tank 210, a supply path heater 230 configured to heat the heating medium of the second heating medium tank 210 to a target temperature, a recovery path heater 240 configured to heat the recovered heating medium and transmit the heating medium to the heating medium tank, and a second 3-way switching valve 250 configured to provide a certain ratio of the heating medium heated by the supply path heater 230 to a target temperature to the mixer 310 and bypass the remaining heating medium to the recovery path heater 240.

There are provided the mixer 310 configured to mix the heating media provided through the first and second 3-way switching valves 150 and 250 for distributing the mixed and recovered heating medium and provide the mixed heating medium to the load at a controlled temperature, and a third 3-way switching valve configured to distribute the heating medium recovered from the load according to the ratio to which the heating medium is provided to the mixer 310 to the recovery path thermoelectric element 140 and the recovery path heater 240.

In this configuration, in order to mix the heating media to the target temperature through the mixer 310, the heating medium recovered when a supply flow rate ratio of the first and second 3-way switching valves 150 and 250 is a first ratio: a second ratio (a sum of the first ratio and the second ratio is preferably 100%) is distributed and supplied to a chiller side and a heater side by a third 3-way switching valve 320 according to the first ratio: the second ratio.

For example, when a temperature of the heating medium supplied from the chiller side is 0° C., a temperature of the heating medium supplied from the heater side is 60° C. and a target temperature to be supplied to the load is 10° C., a supply ratio of the heating medium of the chiller side is larger than that of the heating medium of the heater side. In this case, the temperature of the recovered heating medium becomes a predetermined temperature close to the target temperature (10° C.). Accordingly, since the temperature of the recovered heating medium further approaches the set temperature of the chiller side, when the heating medium is supplied to the chiller side and the heater side at the same ratio as in the related art, the heating medium of about 10° C. at the heater side should be increased to the set temperature of 60° C., and thus calories consumed at the heater side become excessive.

However, in the embodiment according to the present invention, since the recovered heating medium is distributed according to the ratio upon the mixing, the recovered heating medium of about 10° C. is distributed to the chiller at a larger ratio.

That is, when the target temperature approaches the heating medium temperature of the heater, only some heating medium from the chiller side is supplied to the mixer and most is circulated through the bypass, and most of the heating medium from the heater side is provided to the mixer and only some is circulated through the bypass. In this case, since the recovered heating medium approaches the target temperature close to the heating medium temperature of the heater, most of the recovered heating medium is provided to the heater unit, and only some of the heating medium is provided to the chiller side. Accordingly, necessary calories are optimized when the temperature of the heating medium recovered at the heater side is increased or the temperature of the heating medium recovered at the chiller side is decreased.

In particular, as can be seen from the shown embodiment, since the heating medium not provided to the mixer is bypassed to the recovery path thermoelectric element 140 and the recovery path heater 240 rather than only the heating medium of the necessary flow rate of the cooled heating medium and the heated heating medium simply being provided to the mixer 310, the bypassed heating medium is supplied to the recovery path thermoelectric element 140 and the heater 240 with the recovered heating medium. Accordingly, a difference in temperature of the recovered heating medium is reduced by the bypassed heating medium to reduce a thermal shock of the recovery path thermoelectric element 140 or the heater 240 and maintain the heating medium temperature of the heating medium tanks 110 and 210 at a preset temperature. That is, since the heating medium of the chiller unit and the heater unit is continuously circulated, a continuous and stable operating state of the thermoelectric element and the heater can be guaranteed.

In addition, even when the target temperature of the heating medium to be supplied to the load is varied, the variation in temperature can be dealt with simply by varying the ratio of the heated heating medium and the cooled heating medium to be supplied to the mixer 310, and thus the heating medium having the easily varied temperature can be immediately supplied at a sufficient flow rate. In particular, even when the target temperature is abruptly varied so that one of the chiller unit and the heater unit needs supply of 100% heating medium, since a plurality of cooling/heating means deal with the supply, the thermal shock can be minimized to enable rapid control.

Figure 4:
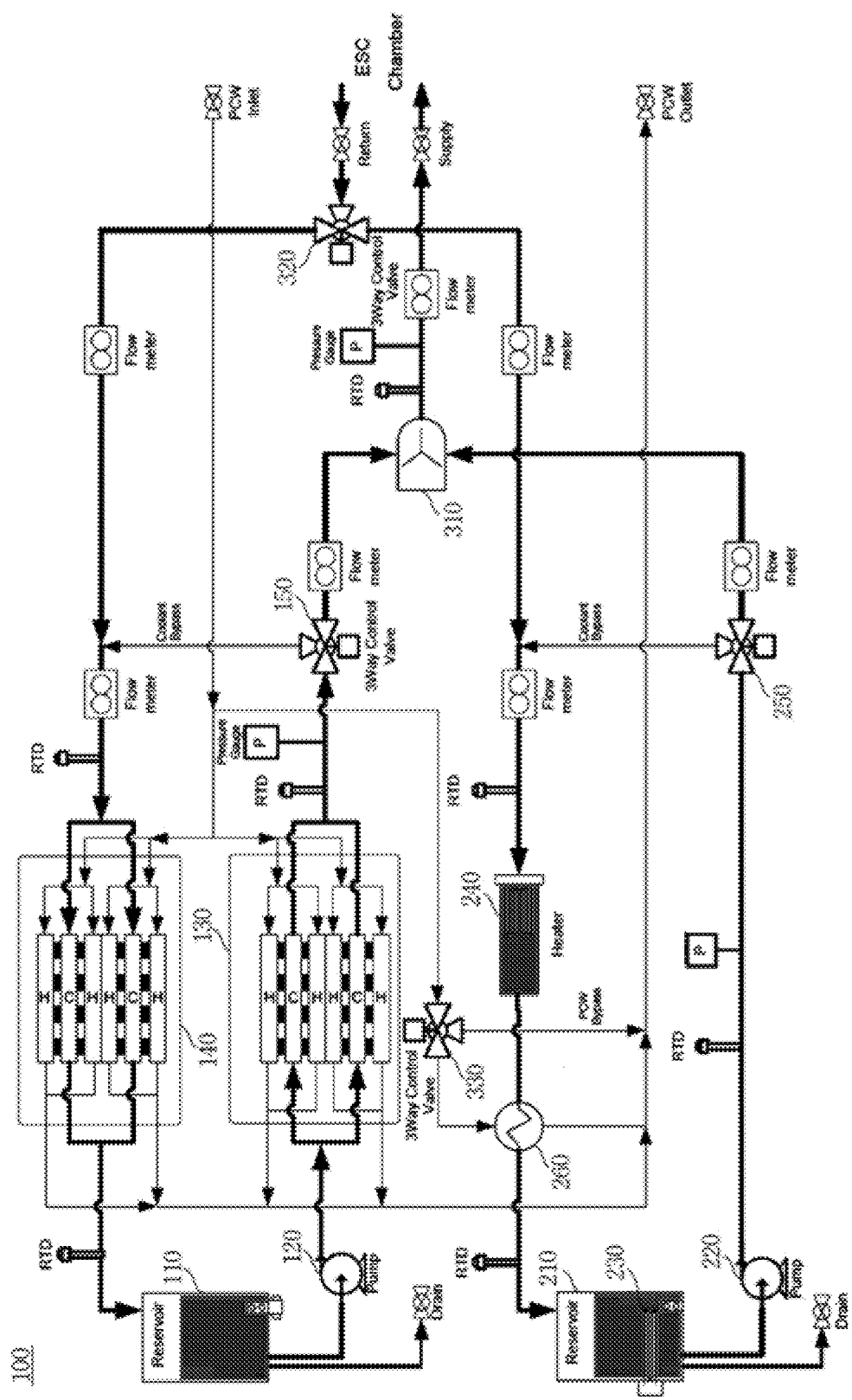
FIG. 4 is a view showing a specific configuration of the temperature control system according to the embodiment of the present invention.

FIG. 4 shows a specific configuration of FIG. 3 that schematically describes a principle of the embodiment of the present invention, and has similar configurations, disposition, and operational theories to FIG. 3 in the thermoelectric elements 130 and 140 for cooling and the heaters 230 and 240 for heating, the heating medium tanks 110 and 210 for heating medium management, the pumps 120 and 220 configured to supply the heating medium in the heating medium tank at an appropriate flow rate, the three 3-way switching valves 150, 250 and 320 and the mixer 310.

However, FIG. 4 shows sensors required for operating a conceptual configuration, and cooling water lines for processing heat generated upon cooling of the heating medium of the thermoelectric element such that the embodiment of the present invention can be more clearly understood.

As shown, temperature sensors configured to measure a temperature are installed at the front and the rear of the thermoelectric elements 130 and 140 and the heaters 230 and 240 and on a flow path through which the heating medium mixed by the mixer 310 is supplied, and for example, a resistance temperature device (RTD) having a large measurement temperature range may be applied as the temperature sensor.

In addition, flow rate sensors (flow meters) are installed at the flow paths that supply to and bypass the mixer 310 by the first and second 3-way switching valves 150 and 250, the flow path through which the heating medium mixed by the mixer is supplied to the load, and the flow path through which the heating medium is distributed by the third 3-way switching valve 320. In substance, the flow rate may be a standard for controlling a mixing ratio of the heating medium mixed by the mixer 310 and a distribution ratio of the recovered heating medium by the third 3-way switching valve 320.

Meanwhile, pressure gauges configured to measure a pressure of the flow path through which the heating medium is supplied to the mixer by the pumps 120 and 220 are installed at the front of the first and second 3-way switching valves, and a pressure gauge configured to measure a pressure of a supply heating medium is installed at the flow path through which the heating medium mixed by the mixer 310 is supplied to the load.

As described above, the temperature sensors, the flow rate sensors and the pressure sensors are installed at the flow paths according to necessity to control temperatures of the thermoelectric elements and the heaters and control the 3-way switching valves.

Meanwhile, as described above, process cooling water (PCW) flow paths configured to cool heat generated on an opposite surface upon cooling of the heating medium is installed at the thermoelectric elements 130 and 140. While the PCW flow path may be configured to be exclusively used for the thermoelectric element to stably operate the thermoelectric elements 130 and 140, the flow path may be used for the heater unit in the shown configuration. That is, the heat exchanger 260 through which the cooling water passes is further installed between the recovery path heater 240 and the heating medium tank 210, and a fourth 3-way switching valve 330 configured to determine whether the cooling water is supplied to or bypasses the heat exchanger 260 is provided to determine use of the heat exchanger 260. The heat exchanger 260 to which the PCW is selectively supplied may be utilized when the heating medium temperature of the heater unit is to be increased or the temperature of the heating medium of the heater unit is to be decreased using waste heat of the cooling water heated due to heat generation of the thermoelectric element incidentally generated upon cooling.

For example, the temperature of the cooling water may be increased by the heat generated due to the cooling operation of the thermoelectric element. When the temperature of the cooling water is 65° C. and the temperature of the recovered and bypassed heating medium heated by the recovery path heater 240 is 55° C., the fourth 3-way switching valve 330 may be operated to supply the cooling water to the heat exchanger 260 to utilize the waste heat of the cooling water to assist the heater. In this case, the heater 240 of the recovery path may be operated to reduce power consumption.

As another example, when the set temperature of the heater unit is adjusted to be lowered, since a temperature decrease speed is low even though the heaters 230 and 240 are not operated, the fourth 3-way switching valve 330 may be operated such that the cooling water having a low temperature is supplied to the heat exchanger 260 to effectively decrease the heating medium temperature of the heater unit.

Meanwhile, in the case of the chiller unit, since the thermoelectric elements 130 and 140 can alternate the cooling and the heating according to a polarity of the supplied power, the temperature can be adjusted to be rapidly increased depending on necessity without a separate configuration.

In the shown case, while the heat exchanger 260 may be disposed between the heaters 230 and 240, the heat exchanger 260 may be disposed somewhere else.

Figure 5:
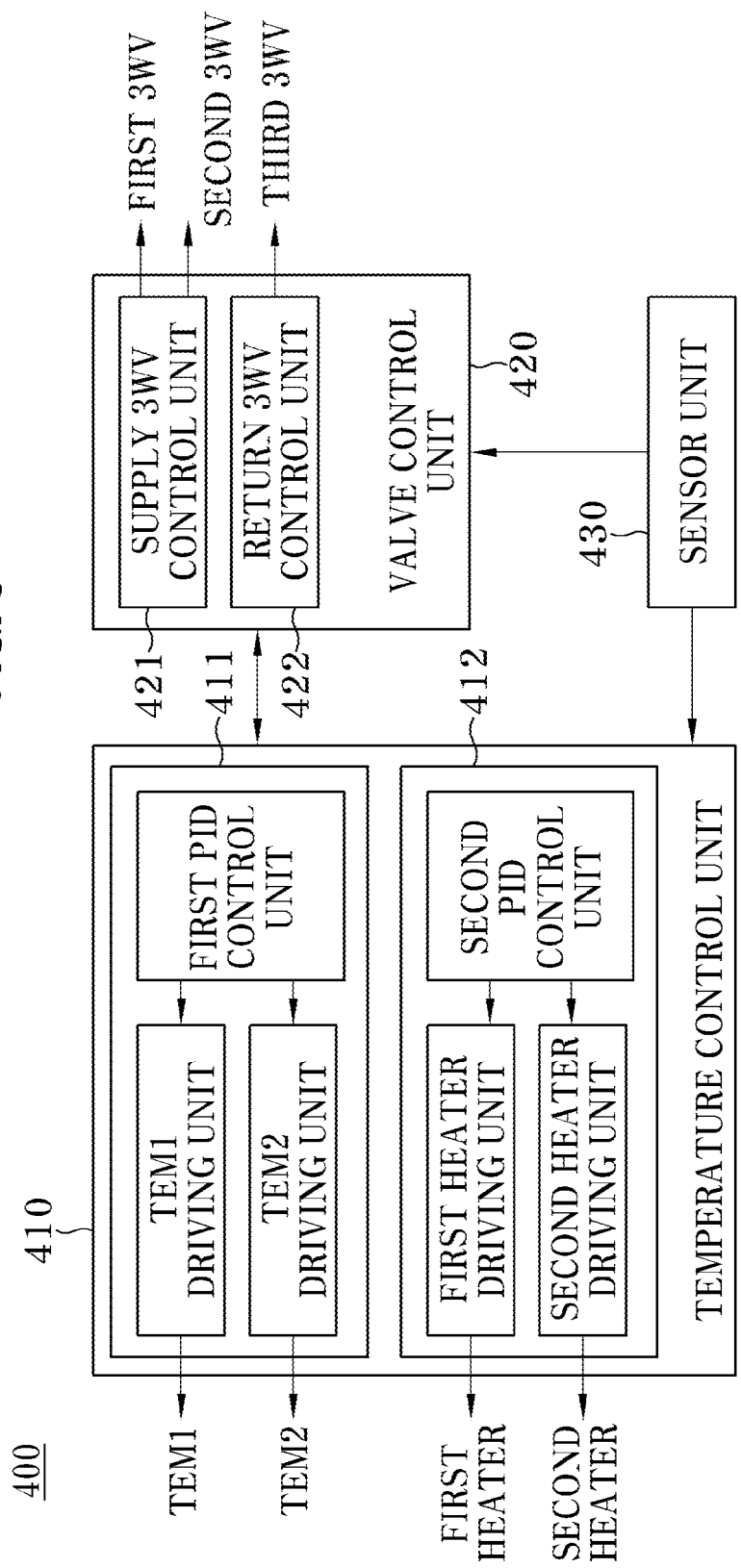
FIG. 5 is a view showing a configuration of a control unit for describing a temperature control method according to the embodiment of the present invention.

FIG. 5 shows a configuration of a control unit 400 configured to substantially control the configuration of FIG. 4 as described above, and as shown, including a sensor unit 430, a temperature control unit 410 and a valve control unit 420.

The sensor unit 430 includes a temperature sensor, a flow rate sensor and a pressure sensor, and provides a measured value to the temperature control unit 410 and the valve control unit 420. Additional sensors may be further provided depending on necessity in addition to these sensors.

The temperature control unit 410 includes a chiller temperature control unit 411 and a heater temperature control unit 412, receives information of a set value (SV) of the target temperature of the heating medium supplied to the load, and controls a temperature and a supply temperature of the heating medium tanks to an appropriate cooling temperature and heating temperature.

The chiller temperature control unit 411 includes a TEM1 driving unit configured to control driving of the supply path thermoelectric element, a TEM2 driving unit configured to control driving of the recovery path thermoelectric element, and a first PID control unit constituted by two PID control units configured to sequentially control the driving units. The first PID control unit performs the PID control with reference to temperatures before and after the actual cooling provided with respect to the recovery path thermoelectric element through the sensor unit 430 and a temperature set therein to cool the recovered and bypassed heating medium to a primary set temperature slightly larger than that of the heating medium to be supplied to the mixer to supply the cooled heating medium to the heating medium tank, and performs a secondary PID control with respect to temperature before and after the actual cooling provided with respect to the supply thermoelectric element through the sensor unit 430 and a set cooling temperature to set the heating medium supplied to the mixer to the set cooling temperature. When a sequential cascade type PID control method is used, control performance with respect to the target temperature can be improved while minimizing the thermal shock.

Similarly, the heater temperature control unit 412 includes a first heater driving unit configured to control driving of the supply path heater, a second heater driving unit configured to control driving of the recovery path heater, and a second PID control unit constituted by two PID control units configured to sequentially control the driving units. The second PID control unit performs the PID control with respect to temperatures before and after the actual heating provided with respect to the recovery path heater through the sensor unit 430 and a temperature set therein to heat the recovered and bypassed heating medium to a primary set temperature slightly lower than the set temperature of the heating medium to be supplied to the mixer to supply the heated heating medium to the heating medium tank, and perform secondary PID control with respect to temperatures before and after the actual heating provided with respect to the supply heater through the sensor unit 430 and a set heating temperature to set the heating medium to be supplied to the mixer to a set heating temperature. When a sequential cascade type PID control method is used, control performance with respect to the target temperature can be improved while minimizing the thermal shock.

The valve control unit 420 includes a supply 3-way switching valve control unit 421 configured to receive a measurement value of the flow rate of the flow path according to an operation of the 3-way switching valve through the sensor unit 430 and control the first 3-way switching valve and the second 3-way switching valve such that the temperature of the heating medium obtained by mixing the heating heated medium and the cooled heating medium in the mixer approaches the target temperature of the heating medium to be supplied to the load, and a return 3-way switching valve control unit 422 configured to control the third 3-way switching valve to distribute the heating medium recovered from the load according to a flow rate ratio set for supplying the heating medium to the mixer.

Of course, if necessary, the valve control unit may further include a valve control unit configured to control a fourth 3-way switching valve configured to determine whether the cooling water for cooling the thermoelectric element is supplied to the heat exchanger installed at the heater side.

Figure 6:
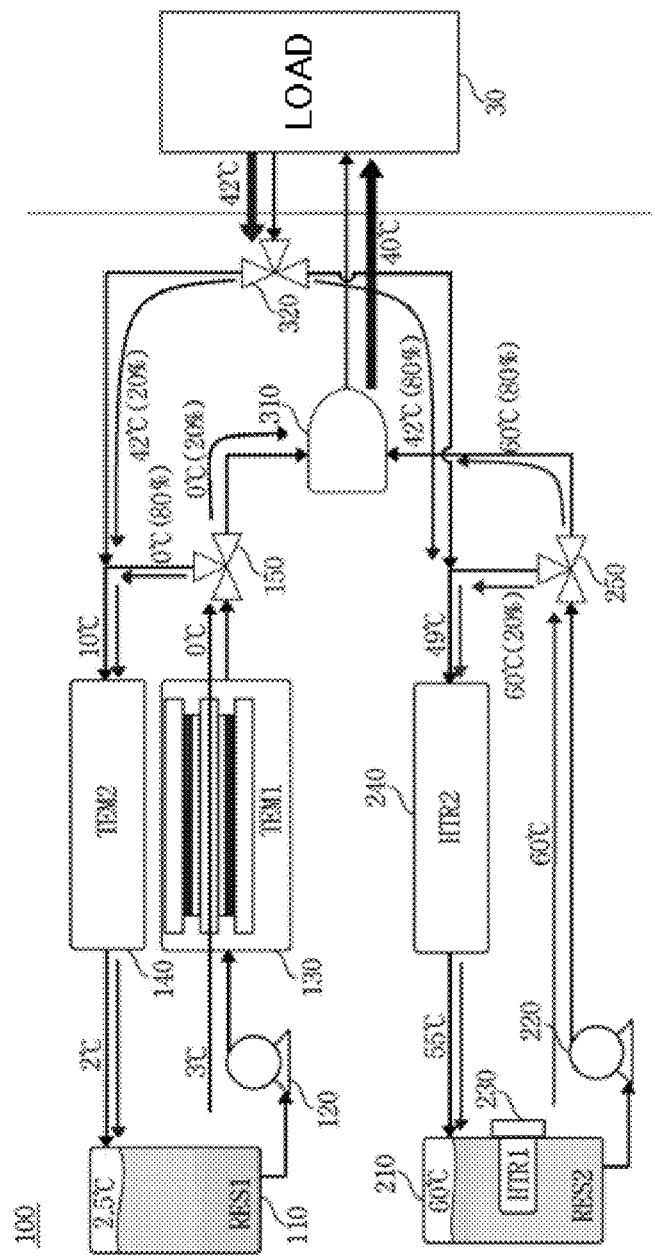
FIG. 6 is a view showing an operation example of the temperature control system according to the embodiment of the present invention.

FIG. 6 shows an exemplary control process for describing a temperature control method according to the embodiment of the present invention. The shown example simply shows a variation in temperature for the convenience of description and is used merely so that an operational principle of the temperature control of the present invention can be understood, and a specific temperature may be varied according to a configuration or a capacity of a specific individual device, a kind of heating medium, a length and a shape of the flow path, a kind of load, or the like.

In the shown example, it is provided that a set temperature of the cooled heating medium provided to the mixer 310 by the chiller unit is 0° C., a set temperature of the heated heating medium provided to the mixer 310 by the heater unit is 60° C., and a temperature required by the load 30 is 40° C.

Since the target temperature required by the load is 40° C., that of the cooled heating medium is 0° C. and that of the heated heating medium is 60° C., the target temperature is close to the temperature of the heated heating medium. Accordingly, a ratio of the heating media mixed in the mixer 310 may be set as the heated heating medium 80% and the cooled heating medium 20%.

Reviewing the operation of the chiller unit, first, the heating medium of the heating medium tank 110 of the chiller unit is maintained at 2.5° C., slightly higher than the set temperature of 0° C. The heating medium of this temperature is provided to the supply path thermoelectric element 130 through the pump 120. The temperature of the heating medium may be slightly increased to 3.0° C. while passing through the pump 120. The supply path thermoelectric element 130 cools the heating medium to the set temperature of 0° C. to supply the cooled heating medium to the first 3-way switching valve 150.

Since the supply path thermoelectric element 130 cools the heating medium primarily cooled and stored in the heating medium tank 110 to the set temperature, the temperature of the heating medium can be precisely and easily maintained through the PID control.

The first 3-way switching valve 150 provides 20% of a flow rate the supplied cooled heating medium to the mixer 310 and provides 80% of the flow rate to the recovery path thermoelectric element 140 through the bypass path.

The recovery path thermoelectric element 140 cools the heating medium obtained by mixing the bypassed cooled heating medium and the heating medium of 42° C., which is supplied at 40° C. and recovered through the load, to a primary cooling temperature of 2° C. to provide the cooled heating medium to the heating medium tank 110. Since the heating medium supplied to the recovery path thermoelectric element 140 is formed of the bypassed heating medium of 0° C. at 80% and the recovered heating medium of 42° C. at 20%, the heating medium is provided at a temperature of about 10° C. and thus the load for cooling is reduced.

Reviewing an operation of the heater unit, the heating medium of the heating medium tank 210 of the heater unit is maintained at a set temperature of 60° C. by the supply path heater 230. The heating medium of this temperature is supplied to the second 3-way switching valve 250 through the pump 220.

Since the supply path heater 230 heats the heating medium primarily heated and provided to the heating medium tank 210 to the set temperature, the temperature of the heating medium can be precisely and easily maintained through the PID control.

The second 3-way switching valve 250 provides 80% of a flow rate of the supplied heated heating medium to the mixer 310 and provides 20% of the flow rate to the recovery path heater 240 through the bypass path.

The recovery path heater 240 heats the heating medium obtained by mixing the bypassed heated heating medium and the heating medium of 42° C., which is supplied at 40° C. through the load, slightly heated and recovered, to a primary heating temperature of 55° C. to provide the heated heating medium to the heating medium tank 210. Since the heating medium supplied to the recovery path heater 240 is formed of the bypassed heating medium of 60° C. at 20% and the recovered heating medium of 42° C. at 80%, the mixed heating medium is provided at an increased temperature of about 49° C. and the load for heating is reduced.

The mixer 310 supplies the heating medium of 40° C. obtained by mixing the heating medium of 0° C. at 20% and the heating medium of 60° C. at 80% to the load 30, and the heating medium heated to a temperature of 42° C. by the load is recovered to the third 3-way switching valve 320. The recovered heating medium is distributed to a chiller-side recovery path at 20% and to a heater-side recovery path at 80% according to the ratio upon the supply.

Accordingly, the thermal shock can be reduced and the calories for cooling or heating the recovered heating medium can be minimized while providing the heating medium of the desired target temperature at a sufficient flow rate through the above-mentioned configuration and control method.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A temperature control system configured to cool and heat heating medium recovered from an operating load of a semiconductor manufacturing system, the temperature control system comprising:

a mixer configured to mix a low temperature heating medium and a high temperature heating medium and supply the mixed heating medium to the operating load of the semiconductor manufacturing system;

a first heating medium tank configured to store the low temperature heating medium;

a thermoelectric element block configured to cool the heating medium and provide the heating medium to the first heating medium tank;

a first 3-way switching valve configured to provide the cooled heating medium of the first heating medium tank to the mixer at a first ratio and bypass the remaining heating medium to be recovered in the first heating medium tank through the thermoelectric element block;

a second heating medium tank configured to store the high temperature heating medium;

a heater configured to heat the heating medium and provide the heating medium to the second heating medium tank;

a second 3-way switching valve configured to provide the heated heating medium of the second heating medium tank to the mixer at a second ratio and bypass the remaining heating medium to be recovered in the second heating medium tank through the heater;

a third 3-way switching valve configured to distribute the heating medium recovered from the operating load to the thermoelectric element block and the heater;

a sensor unit configured to measure a temperature of the heating medium cooled by the thermoelectric element block and a temperature of the heating medium heated by the heater, and measure a flow rate of a connecting section of the first, second and third 3-way switching valves according to operations of the valves;

a temperature control unit configured to receive set values of a cooling temperature of the thermoelectric element block, a heating temperature of the heater, and a temperature of the mixed heating medium to be supplied to the operating load, and control operations of the thermoelectric element block and the heater with reference to the temperatures of the sensor unit;

a valve control unit configured to control the first and second 3-way switching valves to the first and second ratios with reference to the flow rates and the temperatures of the cooled and heated heating media provided by the sensor unit, and control an operating ratio of the third 3-way switching valve configured to distribute the recovered heating medium to the thermoelectric element block and the heater according to the first and second ratios upon the supply;

a cooling water flow path passing through the thermoelectric element block to cool the thermoelectric element block; and a heat exchanger connected to the cooling water flow path passing through the thermoelectric element block and configured to selectively exchange heat with the recovered heating medium and the bypassed heating medium provided to the heater by a heat exchange valve, wherein the sensor unit further measures a temperature of the cooling water to be provided to the heat exchanger and temperatures of the recovered heating medium and the bypassed heating medium to be provided to the heater, and the valve control unit controls the heat exchange valve to perform heat exchange when the temperature of the cooling water to be provided to the heat exchanger is within a range in which a temperature of the heating medium obtained by mixing the recovered heating medium and the bypassed heating medium provided to the heater is able to be heated or cooled to a desired temperature.

2. The temperature control system for the semiconductor manufacturing system according to claim 1, wherein the thermoelectric element block comprises a first thermoelectric element block configured to cool the heating medium in the first heating medium tank to a temperature to be provided to the mixer with reference to the first heating medium tank, and a second thermoelectric element block configured to cool the recovered heating medium and the bypassed heating medium and provide the cooled heating media to the first heating medium tank, and the temperature control unit controls cooling temperatures of the first thermoelectric element block and the second thermoelectric element block differently to reduce a thermal shock.

3. The temperature control system for the semiconductor manufacturing system according to claim 1, wherein the heater comprises a first heater configured to heat the heating medium of the second heating medium tank to a temperature to be provided to the mixer, and a second heater configured to heat the recovered heating medium and the bypassed heating medium and provide the heating media to the second heating medium tank, and the temperature control unit controls the heating temperatures of the first heater and the second heater differently to reduce a thermal shock.

* * * * *